(12) United States Patent
Yang et al.

(10) Patent No.: US 10,483,219 B2
(45) Date of Patent: Nov. 19, 2019

(54) ARRAY SUBSTRATE WITH STATIC CHARGE RELEASING PATTERN AND METHOD FOR PRODUCING THE SAME

(71) Applicants: BOE TECHNOLOGY GROUP CO., LTD., Beijing (CN); Chengdu BOE Optoelectronics Technology Co., Ltd., Chengdu, Sichuan (CN)

(72) Inventors: Xiaofei Yang, Beijing (CN); Zailong Mo, Beijing (CN); Yanxia Xin, Beijing (CN); Ke Dai, Beijing (CN); Yawen Zhu, Beijing (CN); Lei Su, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu. Sichuan Province (CN)

( * ) Notice: Subject to any disclaimer, the term of this patent is extended or adjusted under 35 U.S.C. 154(b) by 70 days.

(21) Appl. No.: 15/502,132

(22) PCT Filed: Aug. 12, 2016

(86) PCT No.: PCT/CN2016/094837
§ 371 (c)(1),
(2) Date: Feb. 6, 2017

(87) PCT Pub. No.: WO2017/118022
PCT Pub. Date: Jul. 13, 2017

(65) Prior Publication Data
US 2018/0047681 A1    Feb. 15, 2018

(30) Foreign Application Priority Data

Jan. 4, 2016 (CN) .......................... 2016 1 0003750

(51) Int. Cl.
*H01L 23/60* (2006.01)
*H01L 27/12* (2006.01)

(52) U.S. Cl.
CPC .............. *H01L 23/60* (2013.01); *H01L 27/12* (2013.01); *H01L 27/127* (2013.01);
(Continued)

(58) Field of Classification Search
CPC .... H01L 23/60; H01L 27/1244; H01L 27/127
(Continued)

(56) References Cited

U.S. PATENT DOCUMENTS 5,068,748 A    11/1991    Ukai et al.
5,909,035 A    6/1999    Kim
(Continued)

FOREIGN PATENT DOCUMENTS

CN    101135820 A    3/2008
CN    102945846 A    2/2013
(Continued)

OTHER PUBLICATIONS

International Search Report and Written Opinion dated Nov. 23, 2016 for corresponding PCT Application No. PCT/CN2016/094837.

(Continued)

*Primary Examiner* — Robert T Huber
(74) *Attorney, Agent, or Firm* — Kinney & Lange, P.A.

(57) ABSTRACT

An array substrate includes a metal pattern and an electrically conductive pattern formed sequentially on a base substrate. The electrically conductive pattern is insulated from the metal pattern; and a static charge releasing pattern is formed in a same layer as the electrically conductive pattern and formed by a same material as the electrically conductive pattern, the static charge releasing pattern being (Continued)

insulated from the electrically conductive pattern and electrically connected with the metal pattern.

14 Claims, 3 Drawing Sheets

(52) U.S. Cl.
CPC ...... H01L 27/1237 (2013.01); H01L 27/1244 (2013.01); H01L 27/1251 (2013.01)

(58) Field of Classification Search
USPC .......................... 257/786, E23.145; 438/637
See application file for complete search history.

(56) References Cited

U.S. PATENT DOCUMENTS

2004/0256675 A1* 12/2004 McNeil .............. H01L 27/0255
257/355
2006/0023135 A1* 2/2006 Park .................. G02F 1/136204
349/40
2008/0023837 A1* 1/2008 Chen ................ H01L 21/76802
257/758
2010/0238095 A1 9/2010 Zhang

FOREIGN PATENT DOCUMENTS

| CN | 103513459 | A | * | 1/2014 | |
| CN | 103513459 | A | | 1/2014 | |
| CN | 104460070 | A | * | 3/2015 | ........... G02F 1/1345 |
| CN | 104460070 | A | | 3/2015 | |
| CN | 104979217 | A | | 10/2015 | |
| CN | 105489596 | A | | 4/2016 | |
| CN | 205385018 | U | | 7/2016 | |

OTHER PUBLICATIONS

First Chinese Office Action, for Chinese Patent Application No. 201610003750.3, dated Sep. 22, 2017, 6 pages.
Second Chinese Office Action, for Chinese Patent Application No. 201610003750.3, dated May 25, 2018, 12 pages.

* cited by examiner

ARRAY SUBSTRATE WITH STATIC CHARGE RELEASING PATTERN AND METHOD FOR PRODUCING THE SAME

CROSS-REFERENCE TO RELATED APPLICATION

This application is a Section 371 National Stage Application of International Application No. PCT/CN2016/094837, filed on Aug. 12, 2016, entitled "ARRAY SUBSTRATE AND METHOD FOR PRODUCING THE SAME" which claims benefit of Chinese Application No. 201610003750.3, filed on Jan. 4, 2016, incorporated herein by reference in their entirety.

BACKGROUND OF THE DISCLOSURE

Field of the Disclosure

The present disclosure relates to a field of display, more particularly, to an array substrate and a method for producing the same.

Description of the Related Art

In the conventional process for producing an array substrate, an electrically conductive pattern is typically deposited by plasma glow discharging method. In this way, in the deposition process, more or less electrons will enter the metal pattern that has been formed previously, such that static charge is accumulated in the metal pattern to cause breakdown of adjacent insulated layers, which in turn leads to short circuit between the metal pattern and other electrically conductive patterns. It may degrade display effects seriously and adversely influence user's experiences.

In view of this, it is desired to provide a technical solution for eliminating the static charges produced from the electrically conductive pattern and entering into the metal pattern during forming the electrically conductive pattern.

SUMMARY

The object of the present disclosure is at least to provide a technical solution that can eliminate the static charges in the metal pattern on an array substrate.

In order to alleviate the above issues, in an aspect, an embodiment of the present disclosure provides an array substrate, including a metal pattern and an electrically conductive pattern formed sequentially on a base substrate, the electrically conductive pattern being insulated from the metal pattern, wherein the array substrate further includes a static charge releasing pattern formed in a same layer as the electrically conductive pattern lies and formed by a same material as the electrically conductive pattern, and wherein the static charge releasing pattern is insulated from the electrically conductive pattern and electrically connected with the metal pattern.

In an example, an insulation layer is provided between the electrically conductive pattern and the metal pattern; and wherein a via hole is provided in the insulation layer and the static charge releasing pattern is electrically connected to the metal pattern through the via hole.

In an example, the metal pattern is a signal line, and wherein the static charge releasing pattern includes: a first static charge releasing pattern arranged in a crimping region of the array substrate and connected with an input end of the signal line; and a second static charge releasing pattern arranged in a display region of the array substrate and connected with an output end of the signal line.

In an example, the first static charge releasing pattern is in a rectangular shape having an area of 25 $\mu m^2$ to 400 $\mu m^2$.

In an example, the metal pattern is a signal line, and wherein the static charge releasing pattern is arranged in a crimping region of the array substrate and connected with an input end of the signal line.

In an example, the metal pattern is a signal line, and wherein the static charge releasing pattern is arranged in a display region of the array substrate and connected with an output end of the signal line.

In an example, the first static charge releasing pattern is connected with the signal line through at least two via holes in the insulation layer.

In an example, the metal pattern is a gate line and the electrically conductive pattern includes a source-drain metal layer pattern.

In an example, the electrically conductive pattern further includes a data line.

In an example, the signal line is a gate line and the electrically conductive pattern includes a source-drain metal layer pattern and a transparent electrode, and the static charge releasing pattern includes: a first portion formed in a same layer as the source-drain metal layer pattern lies and formed by a same material as the source-drain metal layer pattern; and a second portion formed in a same layer as the transparent electrode and formed by a same material as the transparent electrode.

In an example, the transparent electrode is a common electrode or a pixel electrode.

In an example, the metal pattern is a data line and the electrically conductive pattern includes a transparent electrode.

In another aspect, the present disclosure also provides a method for producing an array substrate, the method including a step of forming a metal pattern and an electrically conductive pattern on a base substrate sequentially, wherein in a patterning process of forming the electrically conductive pattern, a static charge releasing pattern insulated from the electrically conductive pattern and electrically connected to the metal pattern is also formed.

In an example, the disclosed method further includes a step of forming an insulation layer which is arranged between the electrically conductive pattern and the metal pattern and has a via hole; wherein the static charge releasing pattern is connected to the metal pattern through the via hole.

In a further aspect, the present disclosure also provides a method for producing an array substrate, including: forming a gate line and a gate insulation layer sequentially; forming one or more first via holes in the gate insulation layer; forming a source-drain metal pattern and a first portion of the static charge releasing pattern in a same layer by a same material by means of a single patterning process, the first portion of the static charge releasing pattern being connected to the gate line through the first via hole formed in the gate insulation layer; depositing a passivation layer; forming one or more second via holes in the passivation layer; forming a transparent electrode and a second portion of the static charge releasing pattern in a same layer by a same material by means of a single patterning process, the second portion of the static charge releasing pattern being electrically connected to the first portion of the static charge releasing pattern through the second via hole/the second via holes formed in the passivation layer.

DETAILED DESCRIPTION OF PREFERRED EMBODIMENTS OF THE DISCLOSURE

In order that the technical problem, solutions and advantages of the present disclosure become clearer, the present disclosure will be explained with reference to accompanied drawings and specific embodiments.

The present disclosure provides a technical solution for solving the problem that static charges are likely to be produced in a metal pattern in the conventional process for producing an array substrate.

Figure 1:
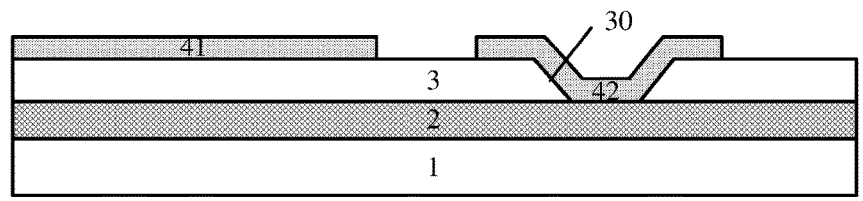
FIG. 1 is a schematic view showing a structure of an array substrate according to one embodiment of the present disclosure.

In an aspect, an embodiment of the present disclosure provides an array substrate. As shown in FIG. 1, the array substrate includes a metal pattern 2 and an electrically conductive pattern 41 formed sequentially on a base substrate 1. The electrically conductive pattern 41 is arranged in a different layer from the layer in which the metal pattern 2 is arranged and is insulated from the metal pattern 2. The array substrate of the present embodiment further includes a static charge releasing pattern 42 formed in a same layer as the electrically conductive pattern 41 lies and formed by a same material as the electrically conductive pattern 41. The static charge releasing pattern 42 is insulated from the electrically conductive pattern 41 (that is, the static charge releasing pattern 42 is separated from the electrically conductive pattern 41) and electrically connected with the metal pattern 2.

In the present embodiment, the static charge releasing pattern connected to the metal pattern is additionally formed in the process for forming the electrically conductive pattern. The static charge releasing pattern is configured to release a part of static charges in the metal pattern to prevent the static charges in the metal pattern from breaking through the metal pattern to the electrically conductive pattern, thereby avoiding short circuit between the metal pattern and the electrically conductive pattern. Since the static charge releasing pattern and the electrically conductive pattern may be formed in one and the same patterning process, the cost for producing the array substrate of the present embodiment will not be greater than that in the prior art. Thus, the array substrate according to the present disclosure is applicable.

As a high resolution display screen with a narrow frame is popular in recent market, an available space in the array substrate becomes reduced. The static charge releasing pattern mentioned in the present disclosure is not present in the prior art, and thus how to arrange it in a limited space becomes difficult.

To this end, the present disclosure provides a technical solution. Generally, the metal pattern in the present embodiment is or indicates a signal line arranged on the array substrate and configured to control a thin film transistor switch. In the conventional array substrate, a crimping region (i.e., PAD region) is provided. In this region, an external connection terminal of the signal line is formed. An external signal apparatus, such as an IC chip for controlling picture display or a probe of a detection apparatus configured to measure yield of the array substrate, transmits a signal to the signal line via the external connection terminal.

To this end, in the present embodiment the static charge releasing pattern may be connected with an input end of the signal line and formed in the crimping region, so that the static charge releasing pattern may also be used as the conventional external connection terminal to save the space of the array substrate. In an example, the static charge releasing pattern may have a rectangular shape to meet requirements of the external connection terminal. The rectangular shape of the static charge releasing pattern may have an area of 25 $\mu m^2$ to 400 $\mu m^2$.

In addition, the static charge releasing pattern in the present embodiment may also be directly arranged in a display region and connected with an output end of the signal line, so as to prevent an outer space of the display region from being occupied, thereby meeting requirements of a size of the display apparatus with a narrow frame.

Certainly, in an embodiment, a plurality of static charge releasing patterns may be provided. Some of the static charge releasing patterns may be used as external connection terminals arranged in the crimping region, and the others may be arranged in the display region and connected to the output end of the signal line.

Further, it should be noted that, as shown in FIG. 1, the electrically conductive pattern 41 and the metal pattern 2 in the embodiment may be insulated from each other by an insulation layer 3 and the static charge releasing pattern may be electrically connected to the metal pattern 2 through a via hole 30 in the insulation layer 3.

Certainly, in practice, the metal pattern in the embodiment is typically the signal line, such as a gate line, a data line and the like. The electrically conductive pattern formed following formation of the signal line may be a transparent electrode or other signal lines. Herein the transparent electrode may be a common electrode, a pixel electrode or the like. The insulated layer described herein may be a pattern layer, or be widely referred to all insulation layers between the metal pattern and the electrically conductive pattern.

With reference to the embodiments of the present disclosure, the structure of the array substrate according to the present disclosure will be explained below in details.

Figure 2:
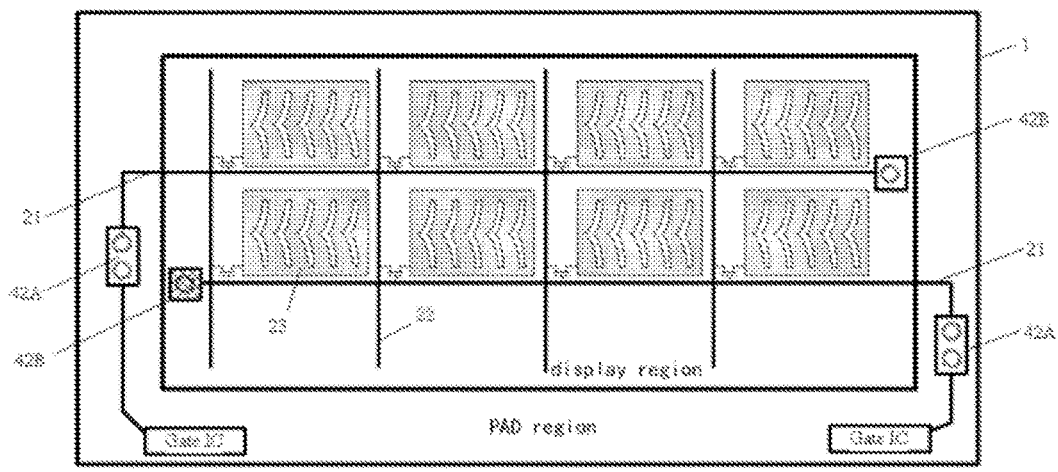
FIG. 2 is a schematic top view of an array substrate according to another embodiment of the present disclosure.

By taking the array substrate having a bottom gate type structure as an example, as illustrated in FIG. 2, the array substrate according to an embodiment includes: a base substrate 1; and a gate line 21, a data line 22, a first static charge releasing pattern 42A and a second static charge releasing pattern 42B formed on the base substrate 1. In an example, the gate line 21 corresponds to the metal pattern described herein; the data line 22 is the electrically conductive pattern described herein; and the first static charge releasing pattern 42A, the second static charge releasing pattern 42B and the data line 22 are formed in a same layer and formed by a same material. It should be noted that in the prior art, a source-drain metal layer pattern and the data line 22 are also formed in the same layer and formed by the same material, and thus the data line 22 in the embodiment may also indicate the source-drain metal layer.

Figure 3:
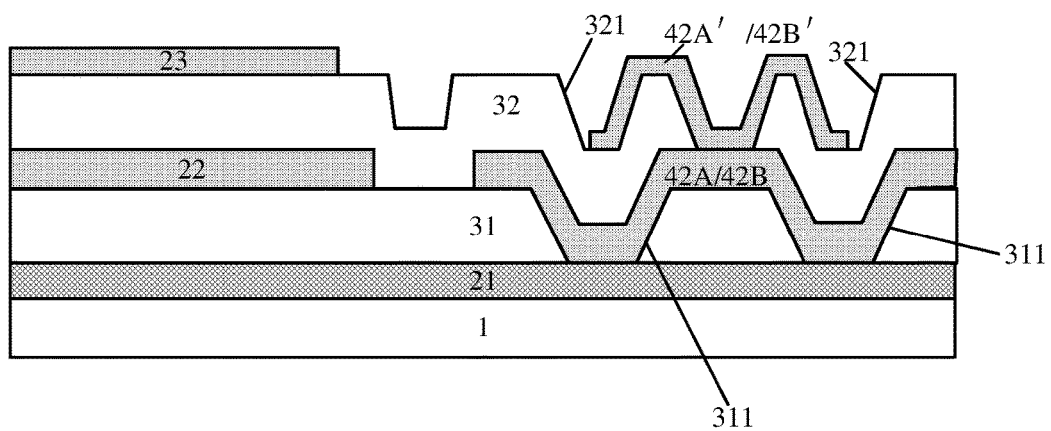
FIG. 3 is a schematic view, in cross-section, of an array substrate with a static charge releasing pattern according to a further embodiment of the present disclosure.

Further, with reference to FIG. 3, a gate insulation layer 31 is provided between the first static charge releasing pattern 42A, the second static charge releasing pattern 42B and the gate line 21. The first static charge releasing pattern 42A and the second static charge releasing pattern 42B are connected to the gate line 21 through a via hole 311 in the gate insulation layer 31. In an example, the first static charge releasing pattern 42A is the external connection terminal arranged on the crimping region as described above. In FIG. 2, the first static charge releasing pattern 42A is connected with a driving circuit Gate IC of the gate line to load a scanning signal from the Gate IC.

If the first static charge releasing pattern 42A is used as the external connection terminal of a test signal line, it may be connected to the probe of the detection apparatus to load a test signal to the gate line 21 or receive the test signal from the gate line 21. Certainly, in order to obtain test results more accurately, resistance of the first static charge releasing pattern 42A may be reduced as much as possible. Thus, as an option, as shown in FIG. 3, the first static charge releasing pattern 42A may be connected with the gate line 21 through a plurality of via holes 311 in the gate insulation layer so as to enhance a cross sectional area for electric conduction.

Further, in the process for producing the array substrate, the data line 22 is not the finally formed electrically conductive pattern. A transparent electrode (such as a common electrode or a pixel electrode) may further be formed above the data line layer. By taking the pixel electrode 23 in FIG. 2 as an example, in the process for forming the pixel electrode 23, the static charges may also be introduced into the data line 22 and the gate line 21. Thus, the technical solution of the present disclosure may also be used to produce the static charge releasing pattern while the pixel electrode 23 is produced. The static charge releasing pattern may be connected to the data line 22 or the gate line 21. If it is connected to the data line 22, the data line 22 will be the metal pattern described herein.

In a practical structure, a passivation layer 32 is arranged between the pixel electrode 23 and the data line 22. The passivation layer 32 is substantially a kind of the insulation layer. Thus, in the embodiment of the present disclosure the static charge releasing pattern, arranged in a same layer as the pixel electrode 23 lies, may be connected to the data line 22 through a via hole formed in the passivation layer.

Certainly, as another option, with reference to FIG. 3, in another embodiment of the present disclosure the static charge releasing pattern 42A'/42B' arranged in the same layer as the pixel electrode 23 may also be electrically connected to the static charge releasing pattern 42A/42B arranged in the same layer as the data line 22 through the via hole 321 in the passivation layer 32. Thus, the static charges produced in the gate line 21 during deposition of the pixel electrode 23 may be released.

Thus, in the embodiment, the static charge releasing pattern may be composed of two parts. One part is arranged in the same layer as the data line 22, and the other part is arranged in the same layer as the pixel electrode 23. Similarly, as a corresponding variant, the static charge releasing pattern 42B' arranged in the same layer as the pixel electrode 23 will substitute the static charge releasing pattern 42B arranged in the same layer as the data line 22 to be used as the external connection terminal.

The above embodiments are provided only by way of examples. The pixel electrode 23 in FIG. 2 may be replaced by a common electrode equivalently. However, all of the static charge releasing patterns that are produced additionally and connected to the previously formed metal patterns in the process for forming the electrically conductive pattern should fall within the protection scope of the present disclosure.

In summary, the array substrate provided with the static charge releasing pattern in the present disclosure may eliminate the static charges produced in the process for producing the metal pattern, and no additional patterning process is needed for producing the static charge releasing pattern and hence the cost for producing the array substrate will not be increased. In addition, the static charge releasing pattern in the embodiment will also not occupy the space at an edge of the array substrate, and can be used for the display apparatus with a narrow frame. It conforms the current development trend of the display apparatus.

An embodiment of the present disclosure also provides a method for producing an array substrate. The method includes a step of forming a metal pattern and an electrically conductive pattern on a base substrate sequentially.

In a patterning process of forming the electrically conductive pattern, a static charge releasing pattern insulated from the electrically conductive pattern and electrically connected to the metal pattern is also formed.

In the method according to the embodiment, the static charge releasing pattern connected with the metal pattern is additionally formed in the process for producing the electrically conductive pattern. The static charge releasing pattern is configured to release part of the static charges in the metal pattern to prevent the static charges from the metal pattern from breaking through the metal pattern to the electrically conductive pattern, thereby avoiding short circuit between the metal pattern and the electrically conductive pattern. Since the static charge releasing pattern may be formed by the patterning process of the electrically conductive pattern, the manufacturing cost of the array substrate in the embodiment will not be increased. The array substrate according to the present disclosure is highly applicable.

In a further embodiment, the method according to the embodiment further includes a step of forming an insulation layer which is arranged between the electrically conductive pattern and the metal pattern. In the step, by forming a via hole in the insulation layer, the static charge releasing pattern is connected to the metal pattern through the via hole in the insulation layer.

The method according to the embodiment will be explained below in details.

Figure 4A:
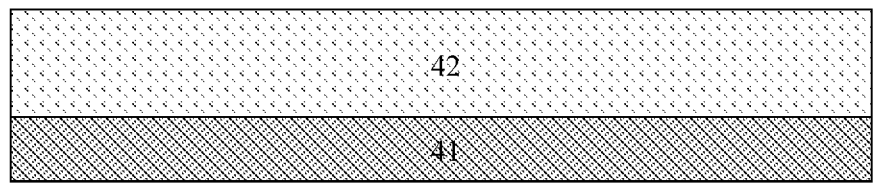
FIGS. 4A to 4F are schematic views showing a flowchart of a method for producing an array substrate according to one embodiment of the present disclosure.
Figure 4B:
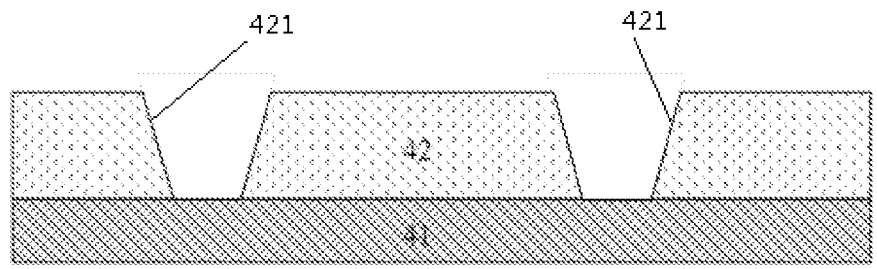
Figure 4C:
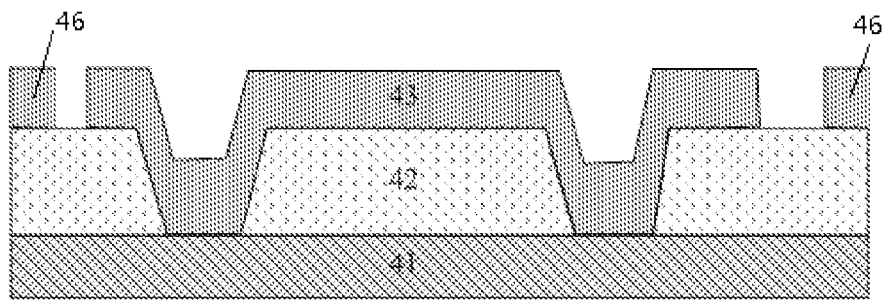
Figure 4D:
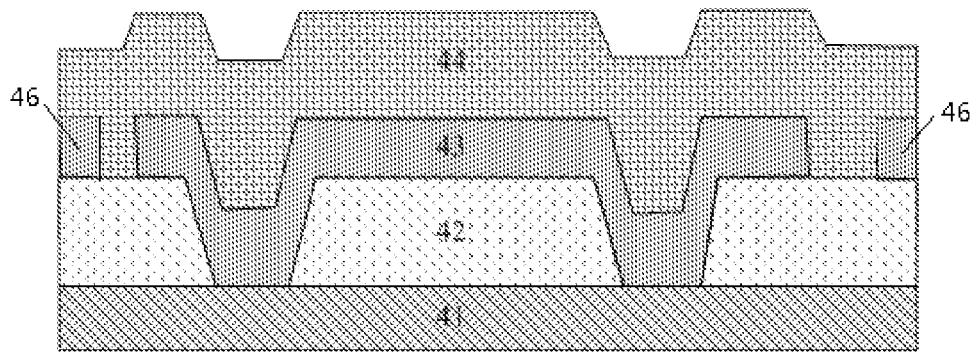
Figure 4E:
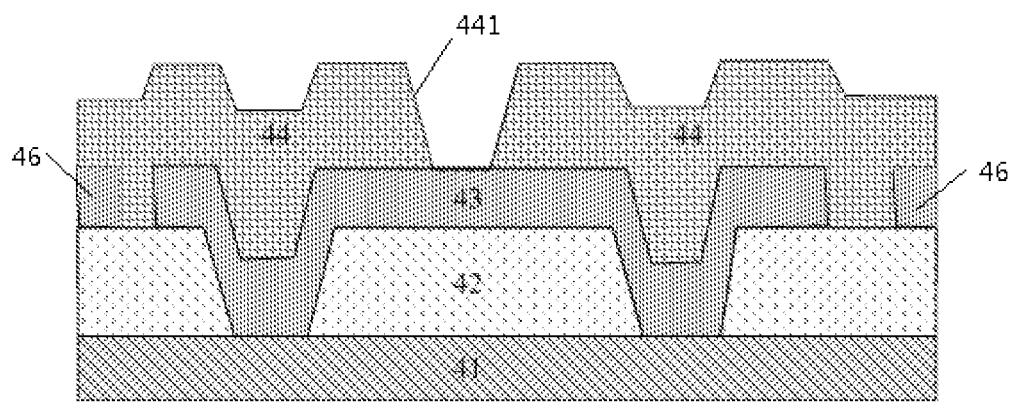
Figure 4F:
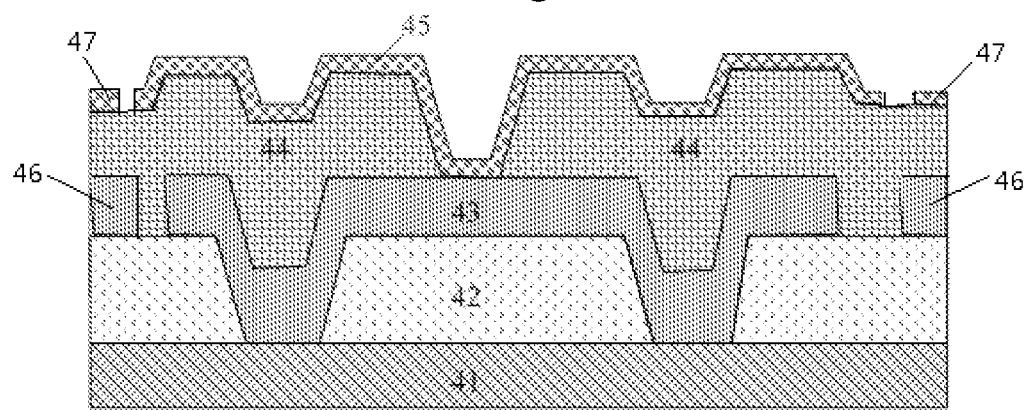

By taking a bottom gate type array substrate as an example, a gate line, a gate insulation layer, a source-drain metal pattern, a passivation layer and a transparent electrode are firstly formed sequentially on the array substrate. In order to eliminate the static charges produced onto the gate line by the source-drain metal pattern and the transparent electrode, the method according to the present disclosure includes:

Step 1, as shown in FIG. 4A, of forming a gate line 41 and a gate insulation layer 42 sequentially;

Step 2, as shown in FIG. 4B, of forming one or more first via holes 421 in the gate insulation layer 42;

Step 3, as shown in FIG. 4C, of forming a source-drain metal pattern and a first portion 43 of the static charge releasing pattern in a same layer by a same material by means of a single patterning process, the first portion 43 of the static charge releasing pattern being connected to the gate line 41 through the first via hole 421 formed in the gate insulation layer 42 in the above Step 2;

Step 4, as shown in FIG. 4D, of depositing a passivation layer 44;

Step 5, as shown in FIG. 4E, of forming one or more second via holes 441 in the passivation layer 44;

Step 6, as shown in FIG. 4F, of forming a transparent electrode and a second portion 45 of the static charge releasing pattern in a same layer by a same material by means of a single patterning process, the second portion 45 of the static charge releasing pattern being connected to the first portion 43 of the static charge releasing pattern through the second via hole 441 formed in the passivation layer 44 in the above Step 5.

In summary, the method according to the present embodiment corresponds to the array substrate of the present disclosure and may provide the same technical effects.

The above embodiments are only exemplary embodiments of the present disclosure. It should be noted that the skilled person in the art may make various modifications and alternations of the present disclosure without departing the principles of the present application. These modifications and alternations also fall within the protection scope of the present disclosure.

What is claimed is:

1. An array substrate, comprising a metal pattern and an electrically conductive pattern formed sequentially on a base substrate, the electrically conductive pattern being insulated from the metal pattern, wherein the array substrate further comprises:
   a static charge releasing pattern formed in a same layer as the electrically conductive pattern and formed by a same material as the electrically conductive pattern,
   wherein the static charge releasing pattern is insulated from the electrically conductive pattern and electrically connected with the metal pattern, and
   wherein the metal pattern is a signal line, the signal line being continuous and comprising an input end and an output end, and the static charge releasing pattern comprises:
      a first static charge releasing pattern portion arranged in a crimping region of the array substrate and connected with the input end of the signal line; and
      a second static charge releasing pattern portion arranged in a display region of the array substrate and connected with the output end of the signal line.

2. The array substrate according to claim 1, wherein an insulation layer is provided between the electrically conductive pattern and the metal pattern; and wherein a via hole is provided in the insulation layer and at least one of the first static charge releasing pattern portion or the second static charge releasing pattern portion is electrically connected to the metal pattern through the via hole.

3. The array substrate according to claim 1, wherein the first static charge releasing pattern portion is in the shape of a rectangle having an area of 25 $\mu m^2$ to 400 $\mu m^2$.

4. The array substrate according to claim 2, wherein the first static charge releasing pattern portion is in the shape of a rectangle having an area of 25 $\mu m^2$ to 400 $\mu m^2$.

5. The array substrate according to claim 1, wherein the first static charge releasing pattern portion is electrically connected with the signal line through at least two via holes in the insulation layer.

6. The array substrate according to claim 1, wherein the metal pattern is a gate line and the electrically conductive pattern comprises a pattern of a source-drain metal layer.

7. The array substrate according to claim 6, wherein the electrically conductive pattern further comprises a data line.

8. The array substrate according to claim 1, wherein the metal pattern is a gate line and the electrically conductive pattern comprises a transparent electrode and a pattern of a source-drain metal layer, and the static charge releasing pattern comprises:
   a first portion formed in a same layer as the pattern of the source-drain metal layer and formed by a same material as the pattern of the source-drain metal layer;
   a second portion formed in a same layer as the transparent electrode and formed by a same material as the transparent electrode.

9. The array substrate according to claim 8, wherein the transparent electrode is a common electrode or a pixel electrode.

10. The array substrate according to claim 1, wherein the metal pattern is a data line and the electrically conductive pattern comprises a transparent electrode.

11. The array substrate according to claim 10, wherein the transparent electrode is a common electrode or a pixel electrode.

12. A method for manufacturing an array substrate, comprising a step of forming a metal pattern and an electrically conductive pattern on a base substrate sequentially, wherein in a patterning process of forming the electrically conductive pattern, a static charge releasing pattern insulated from the electrically conductive pattern and electrically connected to the metal pattern is also formed, the static charge releasing pattern being formed in a same layer as the electrically conductive pattern and formed by the same material as the electrically conductive pattern,
   wherein the metal pattern is a signal line, the signal line being continuous and comprising an input end and an output end, and the static charge releasing pattern comprises:
      a first static charge releasing pattern portion arranged in a crimping region of the array substrate and connected with the input end of the signal line; and
      a second static charge releasing pattern portion arranged in a display region of the array substrate and connected with the output end of the signal line.

13. The method according to claim 12, further comprising a step of:
   forming an insulation layer which is arranged between the electrically conductive pattern and the metal pattern and has a via hole,
   wherein at least one of the first static charge releasing pattern portion or the second static charge releasing pattern portion is electrically connected to the metal pattern through the via hole.

14. A method of manufacturing an array substrate, comprising:
   forming a gate line and a gate insulation layer sequentially;
   forming one or more first via holes in the gate insulation layer;
   forming a source-drain metal pattern and a first portion of a static charge releasing pattern in a same layer and of a same material by means of a single patterning process, the first portion of the static charge releasing pattern being electrically connected to the gate line through the first via hole formed in the gate insulation layer;
   depositing a passivation layer;
   forming one or more second via holes in the passivation layer; and
   forming a transparent electrode and a second portion of the static charge releasing pattern in a same layer and of a same material by means of a single patterning process, the second portion of the static charge releasing pattern being electrically connected to the first portion of the static charge releasing pattern through the second via hole formed in the passivation layer,
   wherein the gate line is continuous and comprises an input end and an output end,
   wherein the static charge releasing pattern comprises:
      a first static charge releasing pattern portion arranged in a crimping region of the array substrate and connected with the input end of the gate line; and a second static charge releasing pattern portion arranged in a display region of the array substrate and connected with the output end of the gate line.

* * * * *